(12) United States Patent
J et al.

(10) Patent No.: US 11,658,667 B2
(45) Date of Patent: May 23, 2023

(54) REDUCTION OF NOISE IN OUTPUT CLOCK DUE TO UNEQUAL SUCCESSIVE TIME PERIODS OF A REFERENCE CLOCK IN A FRACTIONAL-N PHASE LOCKED LOOP

(71) Applicant: Shaoxing Yuanfang Semiconductor Co., Ltd., Shaoxin (CN)

(72) Inventors: Raja Prabhu J, Bangalore (IN); Sandeep Sasi, Bangalore (IN); Harshavardhan Reddy, Bangalore (IN)

(73) Assignee: Shaoxing Yuanfang Semiconductor Co., Ltd., Shaoxing (CN)

( * ) Notice: Subject to any disclaimer, the term of this patent is extended or adjusted under 35 U.S.C. 154(b) by 0 days.

(21) Appl. No.: 17/663,216

(22) Filed: May 13, 2022

(65) Prior Publication Data
US 2023/0006683 A1  Jan. 5, 2023

(30) Foreign Application Priority Data
Jul. 5, 2021   (IN) .............................. 202141030146

(51) Int. Cl.
| | | |
|---|---|---|
| H03L 7/197 | (2006.01) | |
| H03L 7/099 | (2006.01) | |
| H03L 7/093 | (2006.01) | |
| H03L 7/107 | (2006.01) | |

(52) U.S. Cl.
CPC ............ *H03L 7/0992* (2013.01); *H03L 7/093* (2013.01); *H03L 7/099* (2013.01); *H03L 7/1075* (2013.01); *H03L 7/1976* (2013.01)

(58) Field of Classification Search
CPC .. H03K 21/02; H03L 7/16; H03L 7/18; H03L 7/197; H03L 7/1972; H03L 7/1974; H03L 7/1976; H03L 7/1978; H03L 7/199
See application file for complete search history.

(56) References Cited

U.S. PATENT DOCUMENTS

| | | | |
|---|---|---|---|
| 5,903,194 A | * | 5/1999 | Opsahl ................. H03C 3/0933 327/107 |
| 7,375,563 B1 | | 5/2008 | Cheung et al. |
| 9,124,250 B2 | | 9/2015 | Hinrichs |

(Continued)

FOREIGN PATENT DOCUMENTS

EP   2259428 B1   3/2016

OTHER PUBLICATIONS

Wanghua Wu et al., "A 28-nm 75-fsrms Analog Fractional-N Sampling PLL With a Highly Linear DTC Incorporating Background DTC Gain Calibration and Reference Clock Duty Cycle Correction," in IEEE Journal of Solid-State Circuits, , Date of Publication: Mar. 12, 2019, pp. 1254-1265, vol. 54, No. 5, IEEE.

(Continued)

*Primary Examiner* — Levi Gannon
(74) *Attorney, Agent, or Firm* — Phorizons PLLC; Narendra Reddy Thappeta

(57) ABSTRACT

A division factor generator of a feedback divider block in a fractional-N phase locked loop (PLL). The division factor generator is enabled to operate with larger values of division factors without increased complexity of an internal modulator core implemented, for example, as a delta-sigma modulator (DSM) having a signal transfer function (STF), wherein the STF always generates only an integer value as an output in response to an integer value received as input.

14 Claims, 12 Drawing Sheets

(56) References Cited

U.S. PATENT DOCUMENTS

| | | | | |
|---|---|---|---|---|
| 9,219,484 | B2 | 12/2015 | Yao | |
| 10,291,242 | B1* | 5/2019 | Elbadry | H03L 7/099 |
| 10,917,078 | B2 | 2/2021 | Wu et al. | |
| 11,418,205 | B1* | 8/2022 | Schwarz | H03L 7/0992 |
| 2003/0062959 | A1* | 4/2003 | Tsuda | H03L 7/1976 331/17 |
| 2003/0137359 | A1* | 7/2003 | Patana | H03L 7/1976 331/100 |
| 2006/0014513 | A1* | 1/2006 | Uozumi | H03L 7/1976 455/323 |
| 2007/0236297 | A1* | 10/2007 | Uozumi | H03C 3/0925 331/16 |
| 2009/0117856 | A1* | 5/2009 | Kelleher | H03L 7/1976 455/76 |
| 2017/0338940 | A1* | 11/2017 | Zanuso | H03L 7/1976 |
| 2019/0384351 | A1* | 12/2019 | J | H03L 7/093 |
| 2021/0391864 | A1* | 12/2021 | Rafi | H03L 7/0992 |

OTHER PUBLICATIONS

Wanghua Wu et al., "A 5.5-7.3 GHz Analog Fractional-N Sampling PLL in 28-nm CMOS with 75 fsrmsJitter and -249.7 dB FoM," 2018 IEEE Radio Frequency Integrated Circuits Symposium (RFIC), Date of Conference: Jun. 10-12, 2018, pp. 6403-6408, IEEE.
Mohammad Mahdi Ghahramani, Techniques for Frequency Synthesizer-Based Transmitters, https://deepblue.lib.umich.edu/bitstream/handle/2027.42/113385/mammad_1.pdf?sequence=1, Jan. 2015, 118 Pages.

* cited by examiner

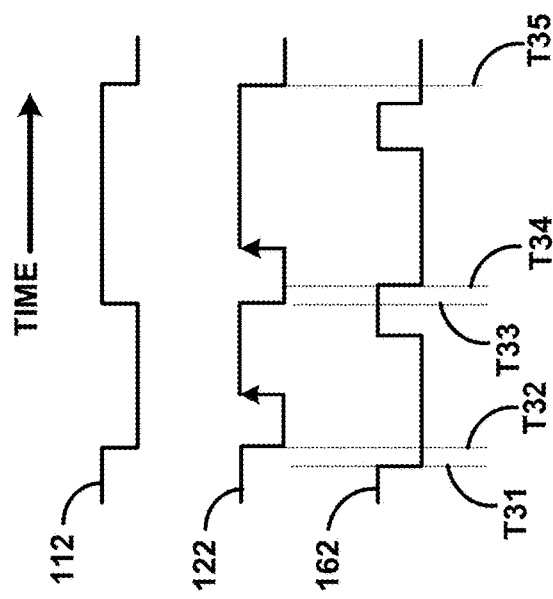
FIG. 3A
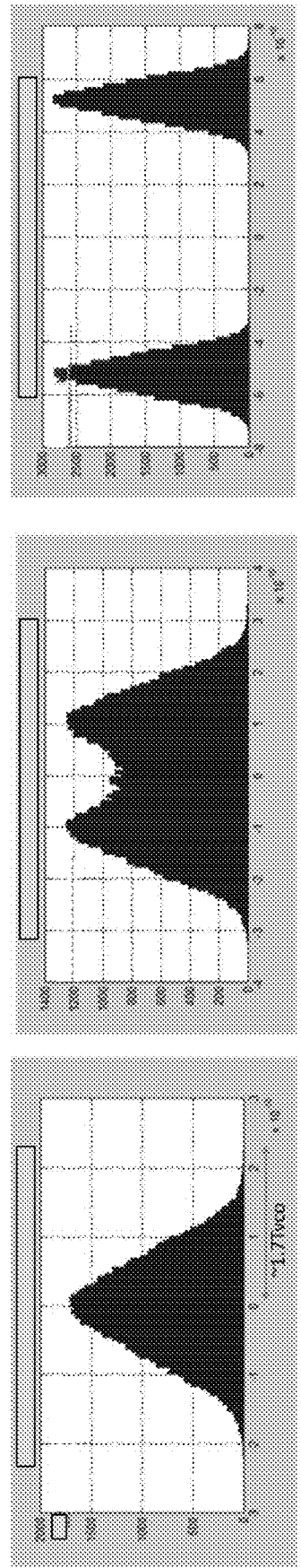
FIG. 3B
FIG. 3C
FIG. 3D

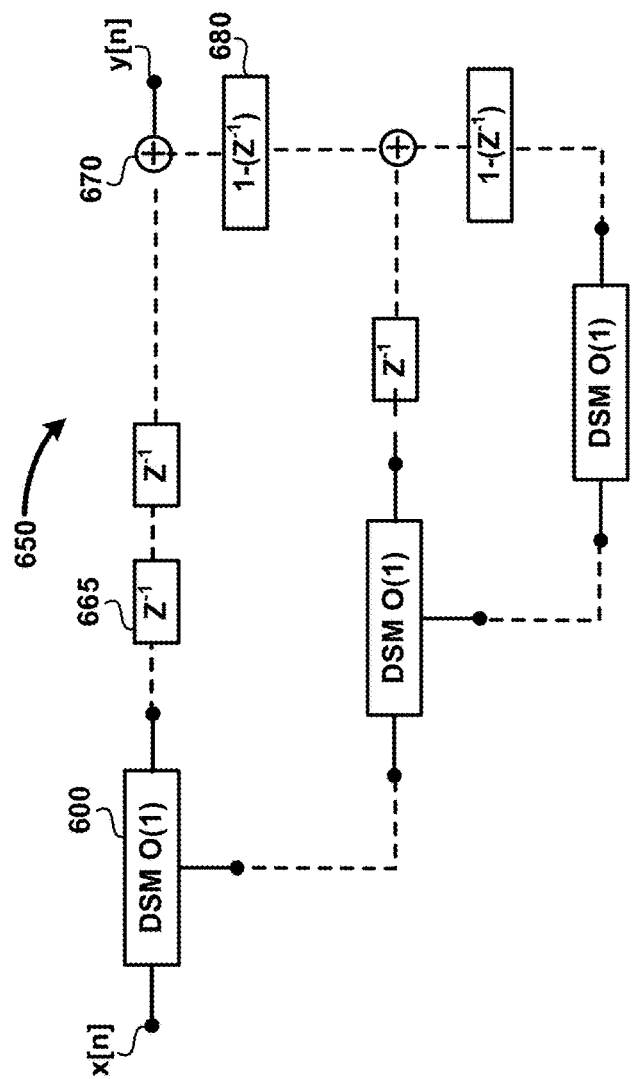
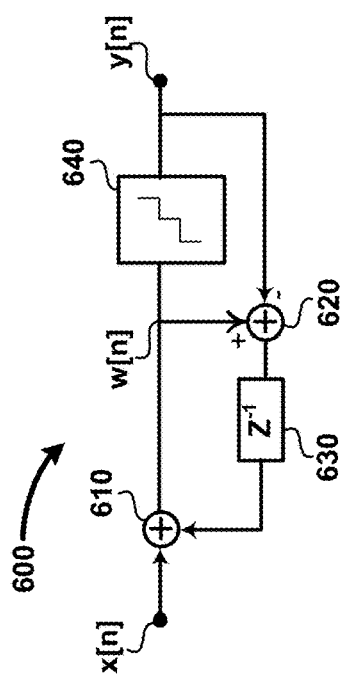
FIG. 6A
FIG. 6B

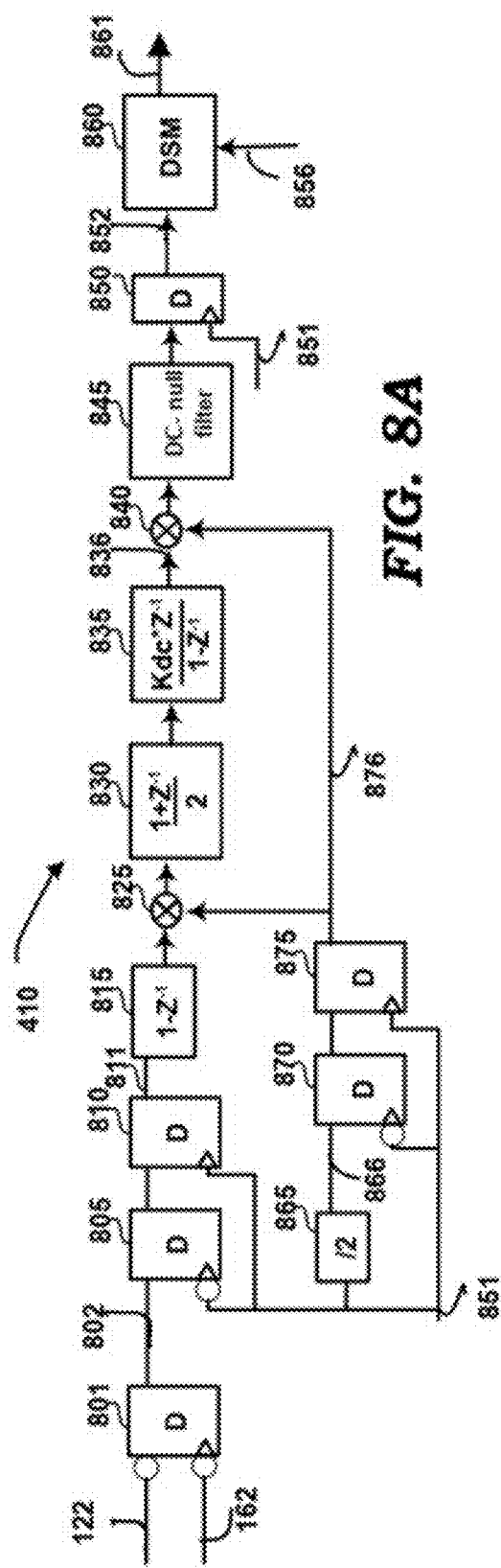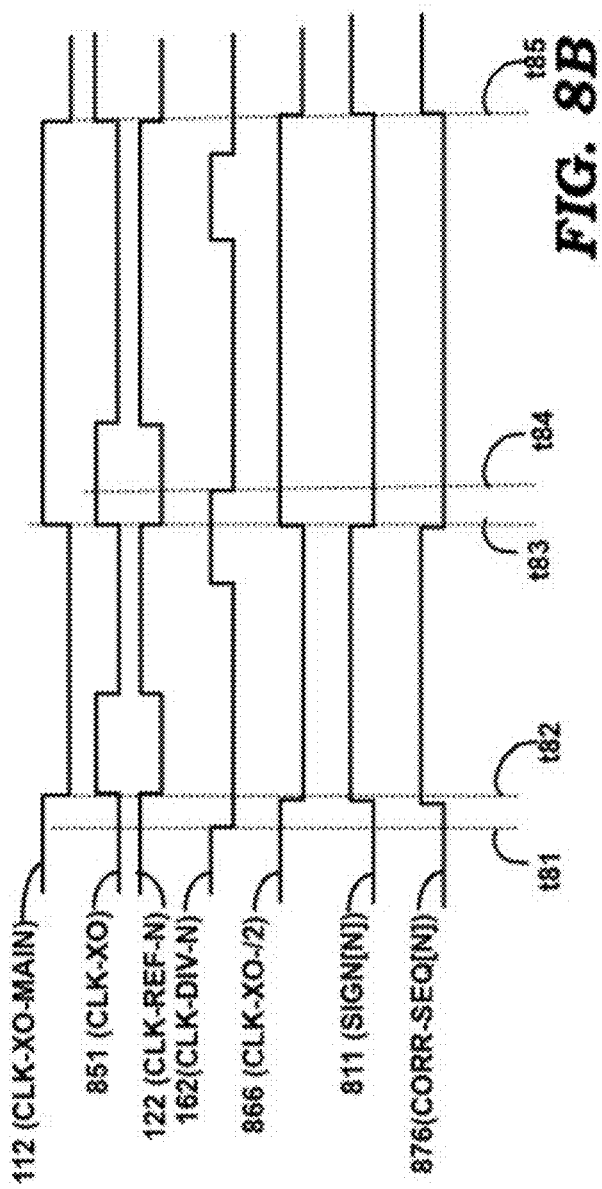
FIG. 8A
FIG. 8B

REDUCTION OF NOISE IN OUTPUT CLOCK DUE TO UNEQUAL SUCCESSIVE TIME PERIODS OF A REFERENCE CLOCK IN A FRACTIONAL-N PHASE LOCKED LOOP

PRIORITY CLAIM

The present patent application is related to and claims the benefit of priority to the co-pending India provisional patent application entitled, "Minimizing Circuit Noise and Frequency Synthesis Error In Reference Clock Duty Cycle Compensation Loop of a Phase Locked Loop System", Serial No.: 202141030146, Filed: 5 Jul. 2021, which is incorporated in its entirety herewith to the extent not inconsistent with the description herein.

RELATED APPLICATIONS

The present patent application is related to co-pending US patent application No. 17,663,217, Entitled, "Reducing Noise Contribution in Compensating for Unequal Successive Time Periods of a Reference Clock in a Fractional-N Phase Locked Loop", inventors Raja Prabhu, et al, Filed: May 13, 2022; which is incorporated in its entirety herewith.

BACKGROUND

Technical Field

Embodiments of the present disclosure relate generally to phase locked loops (PLL), and more specifically to reduction of noise in output clock due to asymmetric source clock in a fractional-N phase locked loop.

Related Art

Fractional-N phase locked loops (PLL) are frequently used to generate an output clock having a frequency that can be a fractional multiple of the frequency of a reference clock received as an input. A fractional multiple refers to a multiple of the general form M.N, wherein M and N are positive integers, and "." represents a decimal point.

Reference clocks may have unequal successive time periods, for example, as the reference clock itself may be derived by techniques such as frequency doubling of an asymmetric source clock. A source clock is said to be asymmetric if the duty cycle (i.e., ratio of ON time and period) is different from 50%. Alternatively, the reference clock generator may use other techniques for generating reference clocks having unequal successive time periods.

Unequal successive time periods in a reference clock typically contributes noise in the output clock. Typically, such noise may manifest as increased output clock jitter as well as reference spurs on either side of the frequency (output frequency) of the output clock. It is desirable to reduce such noise in the output clock.

Aspects of the present disclosure are directed to reducing such noise contribution.

BRIEF DESCRIPTION OF THE VIEWS OF DRAWINGS

Example embodiments of the present disclosure will be described with reference to the accompanying drawings briefly described below.

FIG. 3A is a timing diagram depicting the phase error resulting from a source clock being asymmetric.

FIGS. 3B-3D are plots depicting the respective histograms of the phase error at the phase detector input for three different values of asymmetry of the reference clock in an embodiment.

FIG. 6A is a block diagram of a first order delta sigma modulator (DSM).

FIG. 6B is a block diagram of a MASH-111 DSM.

FIG. 8A is a block diagram of a compensation block in an embodiment of the present disclosure.

FIG. 8B is a timing diagram depicting the signals at some nodes of a compensation block.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A feedback divider block of a fractional-N phase locked loop (PLL) provided according to an aspect of the present disclosure contains a division circuitry and a division factor generator. The division circuitry is designed to divide an output clock of the PLL by a sequence of divisor values to generate a feedback clock, wherein each divisor value is an integer. The division factor generator is designed to generate the sequence of divisor values, wherein the division factor generator contains a splitter and a modulator core.

The splitter is designed to generate a corresponding integer portion and a corresponding residue portion, the sum of which equals a sum of a compensation factor (used to compensate for the effects of unequal successive time periods of a reference clock) and the desired division factor (which determines the frequency of the output clock). The modulator core is designed to generate a respective logic stream of integers corresponding to each residue portion, wherein the logic stream of integers represent a magnitude of the residue portion in a density domain, wherein each integer of the logic stream is added to the corresponding integer portion to generate a corresponding divisor value of the sequence of divisor values.

In an embodiment, the integer portion contains all of the integer value of the sum noted above. The modulator core may be realized by a delta-sigma modulator (DSM) having a signal transfer function (STF), wherein the STF always generates only an integer value as an output in response to an integer value received as input.

In another embodiment, MASH-111 DSM is used, whose STF is a delay value (e.g., $Z^{-2}$). The division factor generator may accordingly include a delay unit to implement the delay value thereby causing the corresponding integer portion to be delayed by the delay value instead of being processed by the modulator core.

Several aspects of the present disclosure are described below with reference to examples for illustration. However, one skilled in the relevant art will recognize that the disclosure can be practiced without one or more of the specific details or with other methods, components, materials and so forth. In other instances, well known structures, materials, or operations are not shown in detail to avoid obscuring the features of the disclosure. Furthermore, the features/aspects described can be practiced in various combinations, though only some of the combinations are described herein for conciseness.

2. Example Device

Figure 1:
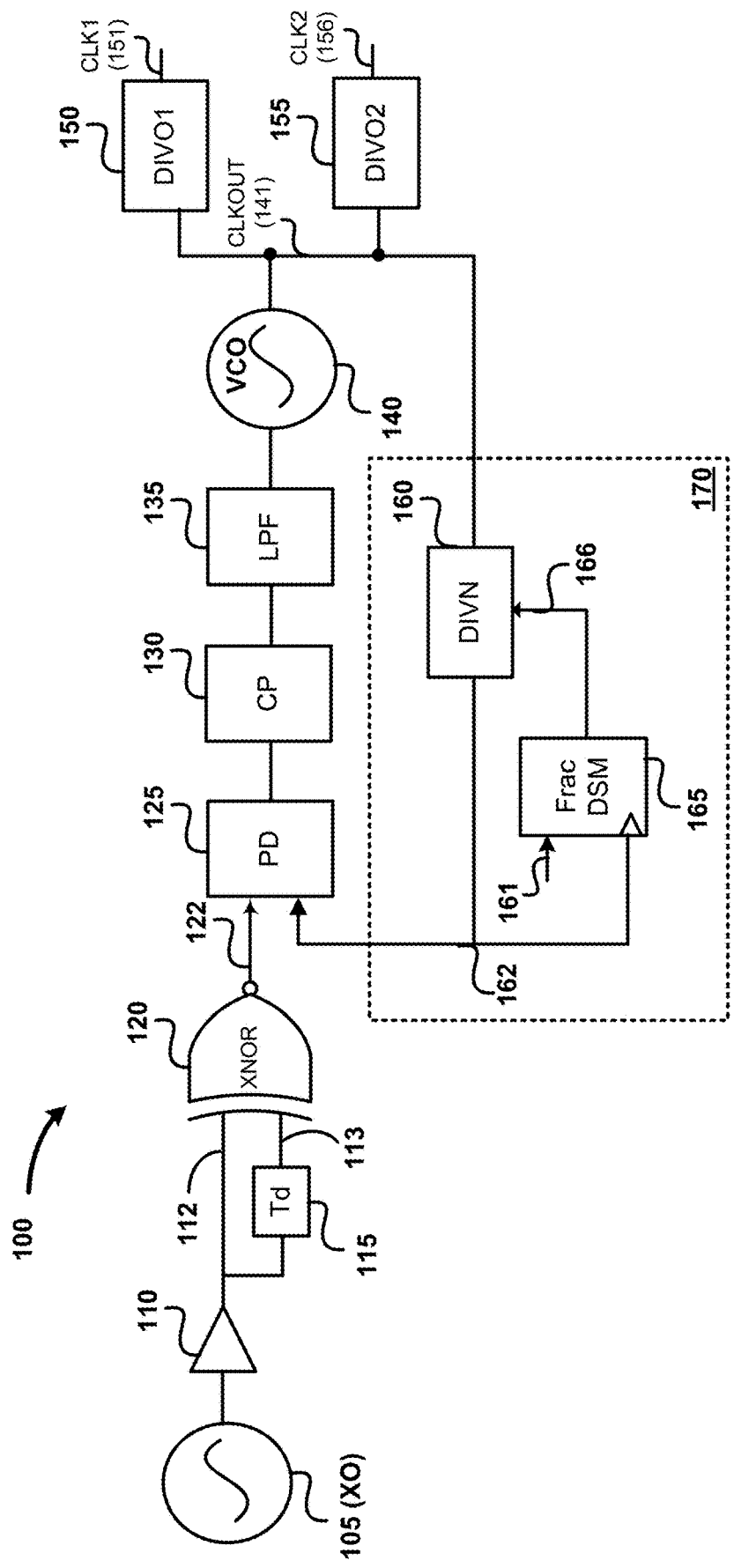
FIG. 1 is a block diagram of an example device in which several aspects of the present disclosure can be implemented.

FIG. 1 is a block diagram of a phase locked loop (PLL). PLL 100 is shown containing crystal oscillator (XO) 105, buffer 110, delay element (Td) 115, XNOR gate 120, phase detector (PD) 125, charge pump (XP) 130, low-pass filter (LPF) 135, voltage-controlled oscillator (VCO) 140, frequency dividers 150 (DIVO1) and 155 (DIVO2), and fractional-N frequency divider block 170. Block 170 is in turn shown containing division circuitry 160 and delta sigma modulator DSM (165). The components and blocks of FIG. 1 are shown merely by way of illustration. In alternative embodiments, PLL 100 may contain more, fewer or differently implemented blocks. For example, PLL 100 can be implemented as an all-digital PLL with PD 125 implemented as a time-to-digital converter (TDC), CP 130 omitted, digital filter in place of LPF 135 and VCO 140 implemented as a digitally-controlled oscillator (DCO). PLL 100 may also be implemented with a combination of analog and digital blocks, as would be apparent to one skilled in the relevant arts.

XO 150 is a crystal oscillator (source clock source) that generates a periodic signal (source clock) having a desired frequency. The signal is buffered and forwarded on path 112 as a source clock clk-xo-main 112 by buffer 110. The source clock 112 is delayed by delay element 115 to generate a delayed clock on path 113. XNOR gate 120 performs an exclusive-NOR logic operation of the clocks 112 and 113 to generate a reference clock 122 (clk-ref-n). The delay element 115 and XNOR operation on clocks 112 and 113 result in reference clock 122 having a frequency that is double that of the source clock. Alternative approaches can be used to generate reference clocks of similar characteristics.

PD 125 generates an error signal representing the phase difference between reference clock 122 and feedback clock 162. In an embodiment, the phase difference is obtained based on the times of occurrences of the falling edges of clocks 122 and 162. The error signal drives a current source and current sink in CP 130, which generates a current proportional to the strength (magnitude and sign included) of the error signal. LPF 135 converts the current to a voltage, and performs low-pass filtering of the voltage to generate a filtered error signal as an output. VCO 140 receives the filtered error signal and generates an output clock 141 with a frequency determined by the strength of the filtered error signal.

Fractional-N frequency divider block 170 divides the frequency of output clock 141 by a desired division factor (fraction or an integer) to generate feedback clock 162. The value of the desired division factor employed by fractional-N frequency divider block 170 determines the steady-state frequency of output clock 141. If the desired division factor is represented by a fraction M.N, then frequency of output clock 141 equals the product of M.N and the frequency (reference frequency) of reference clock 122. N is the integer portion, M is the decimal fraction portion and "." represents a decimal point, and M.N represents a desired division factor to achieve output clock 141 at the desired frequency. Fractional-N frequency divider block 170 includes a division circuitry (DIVN) 160 and a Delta-Sigma Modulator (DSM) 165. DSM 165 receives the division factor M.N on path 161 (e.g., from a user input not shown or from an external device). Based on the value M.N, DSM 165 generates a sequence of divisor values (all integers) on path 166. One divisor value of the sequence is used per cycle of reference clock 122 as the number by which DIVN 160 should divide frequency of output clock 141. The time instant at which DSM 165 is to forward the next divisor value of the sequence is indicated by the active edge of feedback clock 162, which is applied also to the clock input terminal of DSM 165. DSM 165 can be implemented in a known way.

It is generally desirable to have a high-frequency reference clock in order to minimize quantization noise contribution by DSM 165 and noise contribution by VCO 140 to jitter in the output clock CLKOUT 141, and therefore in CLK1 (151) and CLK2 (156) which are derived from output clock 141 by frequency division in frequency dividers DIVO1 150 and DIVO2 155 respectively. Hence a clock doubler (here implemented by the combination of delay element 115 and XNOR gate 120) is typically used in high performance (i.e., low jitter) Fractional-N frequency synthesis applications to generate reference clock at double the frequency of source clock 112.

Figure 2:
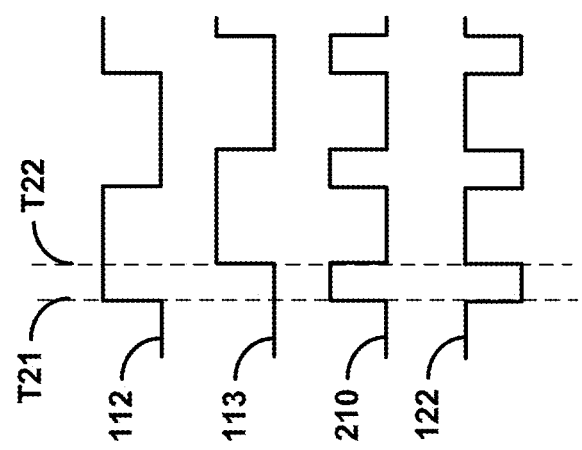
FIG. 2 is a timing diagram illustrating doubling of frequency to generate a reference clock.

FIG. 2 shows the manner in which the clock doubling can be done. A pair of edges of clocks 112 and 113 are shown to occur at time instances T21 and T22. The XNOR operation of XNOR 120 results in generation of reference clock 122 with double the frequency of signal 112. Signal 210 represents the result of XOR operation on signals 112 and 113. Such a technique is well-known.

A non-50% duty cycle (i.e., asymmetry) of the source clock (here 112, generated by XO 105) before the doubler will result in large phase error perturbations of opposite signs alternating between successive reference clock (reference clock 122) edges. This is because, reference clock 122 would have successive periods that alternate between having a shorter period and a longer period, as illustrated below with respect to FIG. 3A. Even at steady state (i.e., when PLL 100 is locked to reference clock 122, and is generating output clock 141 with the desired frequency), the phase error perturbations cause the subsequent blocks (PD, CP, LPF, VCO) to cause non-linear fold-back of DSM 165's quantization noise in-band (i.e., within the pass-band/band-width of PLL 100), thereby elevating the overall jitter in output clock 141.

Alternatively, even when a source clock and frequency-doubling are not used to generate the reference clock, reference clock generator may use other techniques for generating reference clocks having unequal successive time periods. Again, this could result in the phase error perturbations, noise fold-back and the increase of overall jitter in output clock 141.

FIGS. 3A-3D illustrate such foldback. Specifically, FIGS. 3B-3D are plots depicting the respective histograms of the phase error at the phase detector input for three different values of asymmetry of the reference clock (namely reference clock duty cycle of 50%, 49%, 45% respectively).

In FIG. 3A, source clock 112 is shown as having a non-50% duty-cycle (i.e., asymmetric). The doubling operation results in reference clock 122 having unequal successive periods (T32-T33 and T33-T35). However, since output clock 141 always has 50% duty cycle, feedback clock 162 also will always have successive time periods nominally the same excluding the Frac-N DSM related phase movement. At steady-state, the negative edges of reference clock 122 and feedback clock 162 are not aligned. For example, in interval T31-T32 the reference clock negative edge is earlier than that of feedback clock 162, while in interval T33-T34 the reference clock negative edge is later than that of feedback clock 162. Such an alternating pattern repeats, as noted above, causing a non-zero output of PD 125, and subsequent effects in other portions of the feedback loop of PLL 100. FIGS. 3B, 3C and 3D respectively illustrate the phase error distribution (around zero) at the input of PD 125 for the conditions when reference clock duty cycle is 50%, 49% and 45% respectively. In each of FIGS. 3B-3D, the magnitude of phase error is along the y-axis, while the frequency of occurrence of the phase errors are along the x-axis.

The deviation from the ideal 50% duty cycle of source signal 112 results in increase of quantization-noise (due to inherent operation of DSM 165) foldback (into band-width of PLL 100). As a result, jitter in output clock 141 increases. Greater the deviation from 50% (i.e., duty cycle being larger than or smaller than 50%), greater is the foldback and jitter. Therefore, compensation for the duty cycle error in the source clock is usually required. While, the description below is provided in the context of non-50% duty cycle of the source clock and frequency doubling, the description and the techniques are equally applicable in contexts in which a reference clock generator itself generates the reference clock having unequal successive time periods.

3. Compensation for Non-50% Duty Cycle of Source Clock

Compensation for non-50% (asymmetric) source clock duty cycle (when frequency doubling of the frequency of the source clock is used to generate the reference clock) and the resulting effects of increased phase noise (jitter) in output clock 141 can be made in one of several ways. For example, one approach corrects the source clock itself by using delay cells with corresponding delays to cancel the asymmetry in the source clock. However, such an approach may be very difficult in practice and may incur additional noise penalty. A better approach is to sense the non-50% duty cycle (duty cycle error) in the source clock by extracting the phase detector's (125) sign sequence and use that information to modulate DSM 165 to compensate for the source clock duty cycle error. Such an approach is used in an embodiment of the present disclosure, and is illustrated with reference to FIGS. 4 and 5.

Figure 4:
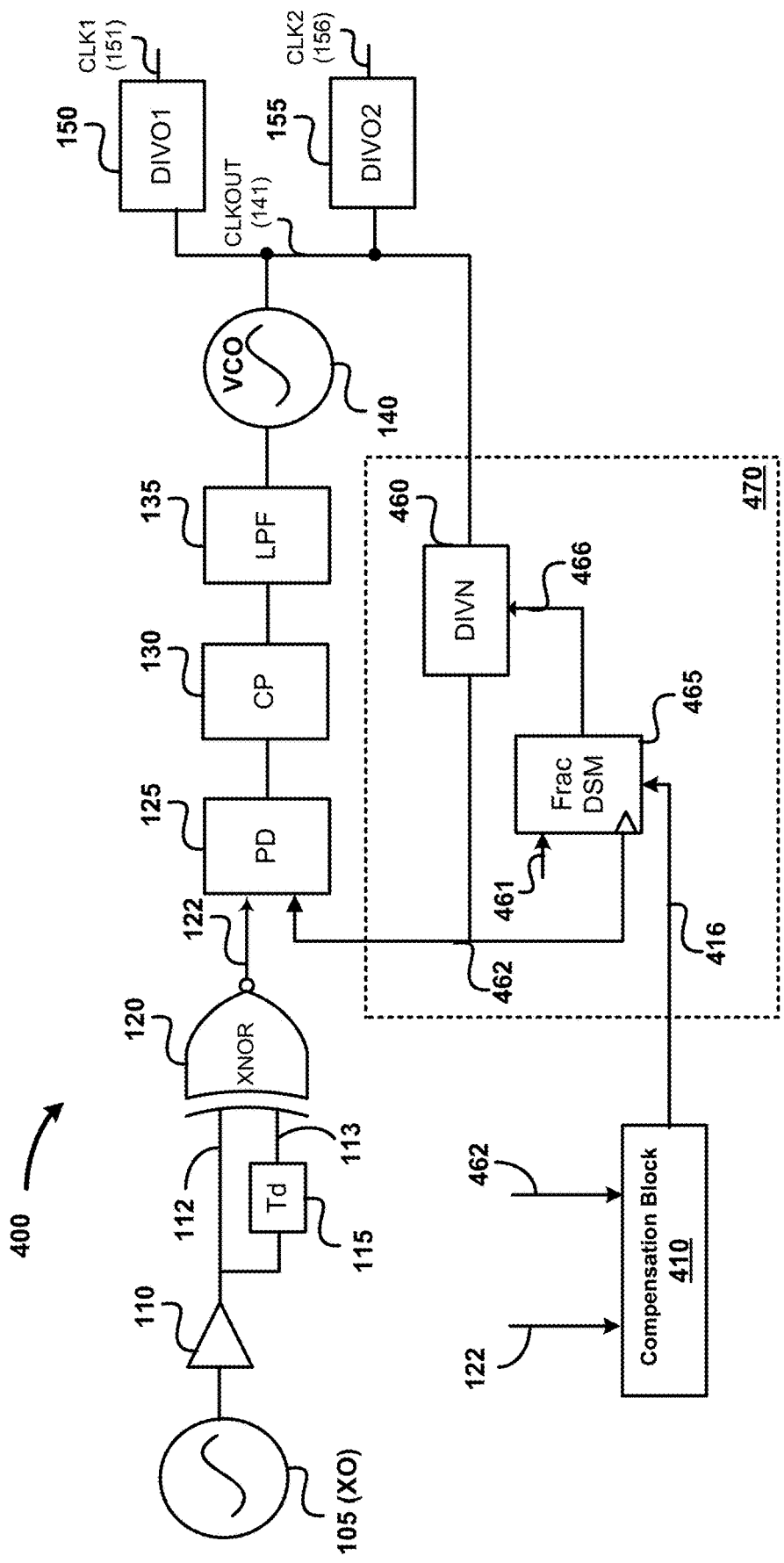
FIG. 4 is a block diagram of a phase locked loop (PLL) that includes a compensation block in an embodiment of the present disclosure.

FIG. 4 is a block diagram of a phase locked loop (PLL) 400 in an embodiment of the present disclosure. The implementation of PLL 400 is the same as that of PLL 100 of FIG. 1, except for the addition of a duty-cycle compensation block and a modification of the DSM of PLL 100. Therefore, in the interest of conciseness, only duty-cycle compensation block and a modified DSM are described next. CLK-OUT 441 represents the output clock, which is substantially free of noise caused due to the asymmetric source clock 112.

Duty cycle compensation block 410 (or simply compensation block 410) operates to sense the non-50% duty cycle (duty cycle error) in the source clock and to generate a compensating factor to compensate for the non-50% duty cycle. Compensation block 410 receives reference clock 122 and feedback clock 462. Based on a processing of these two inputs, compensation block 410 generates and provides a compensation factor to DSM 465 on path 416. The compensation factor is of the form A.B, wherein A and B are respectively the integer portion and decimal fraction portion, and A.B can be a positive or negative fraction. It is possible for A to equal 0. An example implementation of compensation block 410 that processes reference clock 122 and feedback clock 462 is used in an embodiment of the present disclosure, and is described in sections below. However, in other embodiments, and in general, compensation block 410 can be implemented using other techniques, for example by processing other signals in PLL 400 such as for example, source clock 112 or the output of PD 125, as would be apparent to one skilled in the relevant arts.

In fractional-N frequency divider block 470, DIVN 460, and paths 461, 462 and 466 are similar or identical to DIVN 160, and paths 161, 162 and 166 of PLL 100 of FIG. 1, and their description is not repeated here in the interest of conciseness. DSM 465 (delta sigma modulator or in general, division factor generator) is a modified DSM (augmented or modified when compared to DSM 165 of FIG. 1). DSM 465 combines M.N (on path 461) and the compensation factor A.B on path 416 to generate a modified division factor on path 466 in a way that renders the implementation of some internal blocks (specifically modulator core 520, noted below) simpler and more efficient in terms of hardware, as will be apparent from the description below. Specifically, DSM 465 adds M.N to A.B to generate the modified division factor. M.N is normally a fixed value, but can change. On the other hand, A.B could be a fixed value or change from time to time during operation of PLL 400, and the integer part 'A' can be zero or non-zero, as will be described below.

It is well-known in the relevant arts that a DSM generates a string of numbers, i.e., a logic stream of integers that represent a magnitude of the input fraction (161 in FIG. 1) and (sum of M.N and A.B in FIG. 4) in a "density domain". That is the output stream is such that the density of logic 1 is greater for larger values of the input and smaller for smaller values. When the DSM output is represented by a logic stream of multi-bit outputs (as against a single-bit), again the higher values in the stream are denser when the input is higher than lower. Thus, the division factor generator can be referred to as generating the output logic stream that represents its input in the 'density domain'.

The internal implementation of DSM 465 as well as the manner in which the desired division factor M.N is modified by DSM 456 by addition of compensation factor A.B according to aspects of the present disclosure is described next.

4. Division Factor Generator

Figure 5:
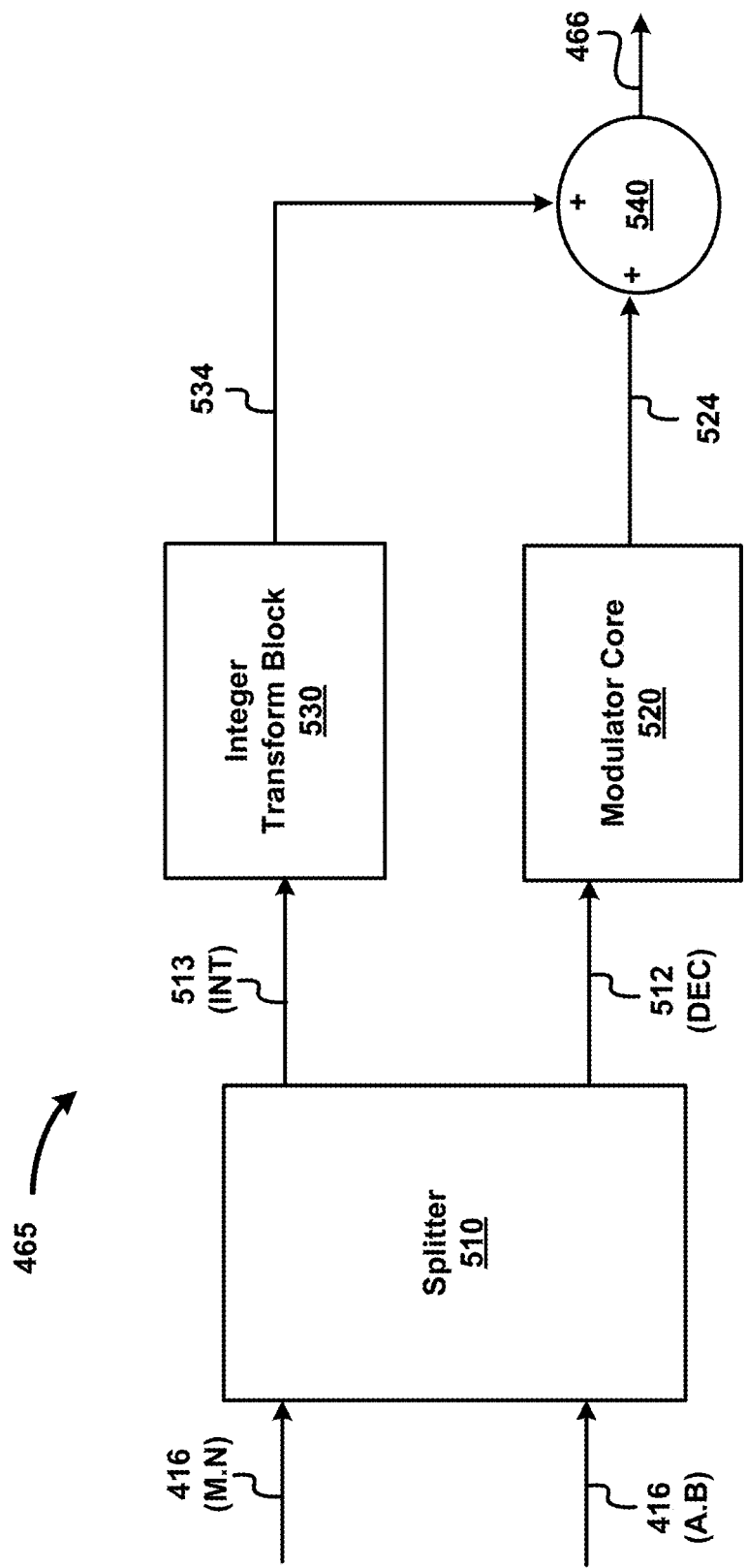
FIG. 5 is a block diagram of a divide factor generator according to an aspect of the present disclosure.

FIG. 5 is a block diagram illustrating the implementation details of DSM 465 in an embodiment of the present disclosure. DSM 465 is shown there containing splitter 510, integer transform block 530, modulator core 520, and adder 540.

Splitter 510 receives the desired division factor (M.N) on path 461 and the compensation factor A.B on path 416, each of which may be represented by multiple bits according to known conventions. Splitter 510 operates to combine the two inputs in the following manner:

1) Add numbers N and B to obtain a fraction C.D.
2) Add the numbers C, M and A to obtain an integer W.
3) Forward integer portion W on path 513 (INT).
4) Forward decimal fraction portion D on path 512 (DEC).

The above combination procedure is now illustrated with an example. M.N is assumed to be 5.6 and A.B is assumed to be 4.7. Adding N and B, i.e., 6 and 7 results in C.D being equal to 1.3. D (i.e., 3) is sent on path 512. C, M and A (i.e., 1, 4 and 5) are added to obtain 10, which is forwarded on path 513.

In the above procedure of combining, only the decimal fraction portion resulting from the addition of M.N and A.B is sent on path 512 to modulator core 520, while all of the resulting integer portion is sent on path 513.

The above noted procedure of combining M.N and A.B provides the benefit that the design of modulator core 520 either needs no change from its design if compensation factor is not applied or required (i.e., as in FIG. 1), or the enhancements to it are minimal, as is illustrated below with reference to FIGS. 6A, 6B and 7.

FIG. 6A is a block diagram of a first-order DSM, and is well known in the relevant arts. DSM 600 receives a signal (in digitized form) and generates a logic stream of numbers y[n] as the output. W[n] is the output of an integration operation. Numerals 610, 620, 630 and 640 respectively represent an adder, a subtractor, a one-sample delay element and a quantizer. FIG. 6B shows a multi stage noise shaping (MASH) DSM (MASH 111), which is made of three DSMs (DSM0(1) 600) each similar or identical to DSM 600 of FIG. 6A plus additional components as shown in the Figure. Each of blocks 665 (labelled $z^{-1}$) is a one-sample delay element. Blocks 680 labelled $[1-(z^{-1})]$ represent a digital differentiator, and blocks 670 are adders. x[n] and y[n] are the input signal and output logic stream respectively.

Continuing with reference to FIG. 5, modulator core 520 performs the delta-sigma operation to generate a logic stream on path 524 representing its input 512. In an embodiment of the present disclosure, modulator core 520 is implemented as a MASH 111 DSM. However, in other embodiments, other types of modulator cores can be used instead provided the signal transfer function (STF) of the modulator core is such that for an integer input, the output is always only integer(s).

Integer transform block 530 receives the input on path 513, transforms the input in a manner specified by the signal transfer function (STF) of modulator core 520. As noted above, the STF must have the property that for an integer input, the output is always only integer(s). When modulator core 520 is implemented as a MASH 111 DSM, the STF is a two-sample delay, i.e., STF=$Z^{-2}$. In general the delay or the value of 'n' is typically determined by the order of the modulator core 520, with n=1 for 2nd order, n=2 for 3rd order and so on.

Integer transform block 530 forwards the transformed input value on path 534. It is noted here that integer portion M of the desired division factor would also be transformed by integer transform block 530.

Adder 540 adds the pair of values received (at respective time instances) on respective paths 534 and 524, and forwards the resulting sum on path 466. The sum 466 is a sequence of divisor values that are provided to DIVN 460 for division of the VCO output (CLKOUT).

Figure 7:
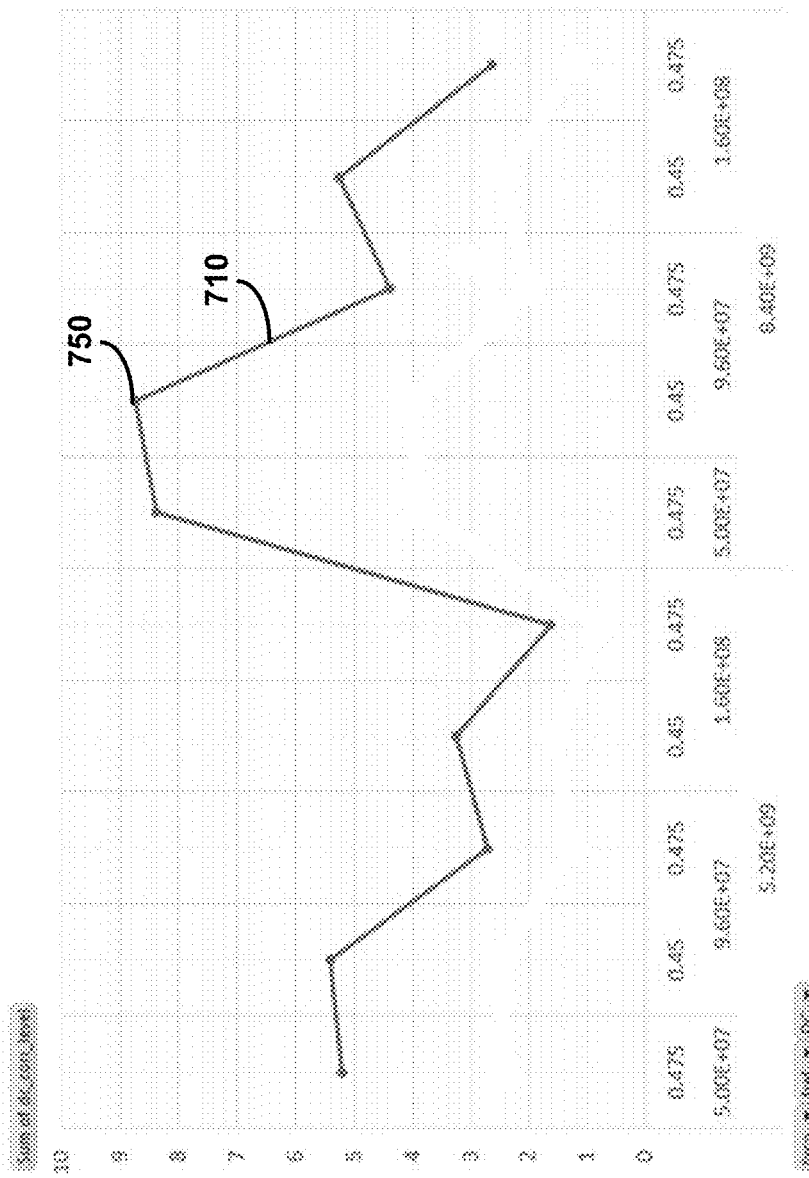
FIG. 7 is a plot depicting the magnitude of duty cycle correction values in an embodiment.

FIG. 7 is a diagram illustrating the magnitudes of duty cycle (DC) correction values (on the y-axis) for various values of duty cycle error and frequencies of the source clock and VCO clock. Markers 710 is a curve/plot for the DC corrections values for the cases when modulator core 520 is implemented as MASH 111. To accommodate the highest value of DC correction indicated by marker 750, an additional 4-bits width for the input on path 512 would be required for the case of MASH 111. The 2-bit quantizer implemented in each of the three first-order DSMs (660 of FIG. 6B) would need to change to 5 bits. One or more of the internal digital paths, as well as components/blocks of FIG. 6B would need to be increased correspondingly.

Thus, modulator core 520 would have to re-designed/upgraded to support the changes. However, by combining M.N and A.B as noted above, the input range of modulator core 520 remains the same as when compensation factor is not applied/used, and no modifications to modulator core 520 are needed, i.e., modulator core 520 designed to support the input range when compensation factor is not required/used can be re-used without any modification. Thus, the combining technique is hardware efficient.

The implementation of a compensation block in an embodiment of the present disclosure is described next.

5. Compensation Block

FIG. 8A is a block diagram illustrating the implementation details of a compensation block employed in a fractional-N PLL in an embodiment of the present disclosure. Compensation block 410 is shown containing D flip-flops 801, 805, 810, differentiator 815, multiplier 825, filter 830, accumulator 835, multiplier 840, DC-null filter 845, D flip-flop 850, DSM 860, divide-by-2 block 865 and D flip-flops 870 and 875. The operation of compensation block 410 is now briefly described with combined reference to FIGS. 8A and 8B. FIG. 8B shows example waveforms for signals 112, 851, 122, 162, 866, 811 and 876. The specific details of compensation block 410 are shown by way of illustration only, and various modifications or alternative choices of design and components/blocks would be apparent to one skilled in the relevant arts upon reading the disclosure herein.

Referring to FIG. 8A, D flip-flop 801 generates as output 802, the sign (i.e., whether positive or negative) of the duty-cycle error at each cycle of reference clock 122, the sign being obtained by sampling reference clock at negative edges of the feedback clock 162. Similar to as noted with respect to FIG. 3A, the duty cycle error (specifically at steady state operation of PLL 400) causes the phase difference to alternate between positive and negative in successive cycles of reference clock. Signal 122 is inverted before being provided as input to D flip-flop 801. CLK-XO 851 which is the inverse of reference clock 122 is used as the clock input to blocks 870, 875, 805, 810 and 850. Sign 802 is passed through D flip-flops 805 and 810 (for clock-domain crossing synchronization), and forwarded as sign[N] 811. Sign[N] 811 is passed through differentiator 815. The differentiated sign[N] is forwarded by differentiator 815 as an input to multiplier 825.

It may be observed from FIG. 8B that when reference clock 122 lags feedback clock 162 (as in interval t81-t82), the phase error is negative, and when reference clock 122 leads feedback clock 162 (as in interval t83-t84), the phase error is positive. It is noted here that the alternative convention can also be used, i.e., positive phase error when reference clock 122 lags feedback clock 162, and negative phase error when reference clock 122 leads feedback clock 162. Based on the choice the sign of Kdc scaling has to be changed for the correction loop to be in negative feedback and converge.

CLK-XO 851 is divided by 2 by block 865 to generate CLK-XO/2 866, which is passed through D flip-flops 870 and 875 (which together provide the function of synchronizer) to generate signal CORR-SEQ-N 576 (correlation sequence), which is forwarded as an input to multipliers 825 and 840. Signal 876 indicates the 'current' (i.e., at the current time of operation of compensation block 410 and PLL 400) half cycle of the clock period of source clock 112, or equivalently the current one of the two unequal clock periods of reference clock 122.

Referring to one half cycle of source clock 112 as odd cycle (e.g., interval t82-t83) and the other half cycle (e.g., interval t83 to t85) as even cycle, a logic value of 1 of signal 876 indicates that the current half cycle is an odd cycle, and a value of 0 indicates that the current cycle is an even cycle. As will be apparent from the description below, the correlation sequence 876 is needed for precisely identifying the start of each of the pairs of unequal successive periods of reference clock 122, since the times of generation/availability of the corresponding correction factors generated at various nodes in compensation block 410 may not align with the start of each of the pairs of unequal successive periods of reference clock 122, due to delays/noise in one or more blocks in the correction pathway from block 801 to input of DSM 860. Correlation sequence 876 is also needed to multiply the delta-fs generated at the inputs of each of multipliers 825 and 845 by +1 or −1 to correctly generate the final +delta-f and −delta-f values.

Example waveforms of CLK-XO-MAIN 112, CLK-XO 851, reference clock 122 (also noted as CLK-REF-N) and feedback clock 162 (also noted as CLK-DIV-N) are shown in FIG. 8B. Their example values may be ascertained by referring to the diagram of FIG. 8A.

It may be appreciated from the description above, and from FIG. 3A, that for every shorter time period of reference clock 122, the time period of feedback clock needs to be corrected by making it shorter. Similarly, for every longer time period of reference clock 122, the time period of feedback clock needs to be corrected by making it longer. As a result, all cycles of reference clock 122 become aligned with all the cycles of the feedback clock 162, thereby eliminating any noise contribution. Compensation block 410 operates to perform the above-noted correction by reducing/ increasing the divide value of DIVN 460 by generating a correction factor +delta-f/−delta-f on path 852, the input of DSM 860. The two correction factors have equal magnitudes but opposite signs, as may be understood from the description above.

In operation, the phase error 802 is first converted to a frequency error by differentiator 815 and then correlated (by multiplication in multiplier 825) with the correlation sequence 876 to sense the duty cycle error. The product values generated by multiplier 825 are first filtered by averaging filter 830 (to cancel noise addition due to DSM quantization noise as well as noise introduced by components earlier in the chain (like flip-flops 801, 805, etc.). The filtered product values are then accumulated in accumulator 835 to generate accumulated steady state values on path 836.

The values on path 836 are again correlated with sequence 876 by multiplier 840 to generate correction factors of same magnitude but alternating in sign for reasons similar as those noted above.

The output of multiplier 840 represents compensation factor 461 generated by compensation block 460 (FIG. 4) and contains the correction values, +delta-f and −delta-f at the respective time instants. In an embodiment, the outputs of multiplier 840 are directly passed to path 852 and thus to DSM 860. Input on path 856 of DSM 860 represents the desired division factor M.N noted above, and path 856 corresponds to path 461 of FIG. 4. Thus, in the embodiment, DC-null filter 845 (as well as flip-flop 850) is not implemented.

The addition of the compensation factor to the desired division factor (in DSM 860) causes the alternating positive/ negative phase errors between reference clock and feedback clock to be nulled (made equal to zero), by effectively increasing/decreasing the durations of the feedback clock 162 in corresponding cycles. Such effect may be viewed equivalently also as decreasing and increasing the frequency of the feedback clock in corresponding successive cycles by correspondingly changing (decreasing/increasing) the divide factor applied by DIVN 460. Thus, any addition of noise to output clock 441 (FIG. 4) of PLL 400 that would otherwise have been caused by the non-50% duty cycle of source clock 112 (or unequal periods of successive clock cycles of reference clock 122) is reduced or completely eliminated.

Figure 9:
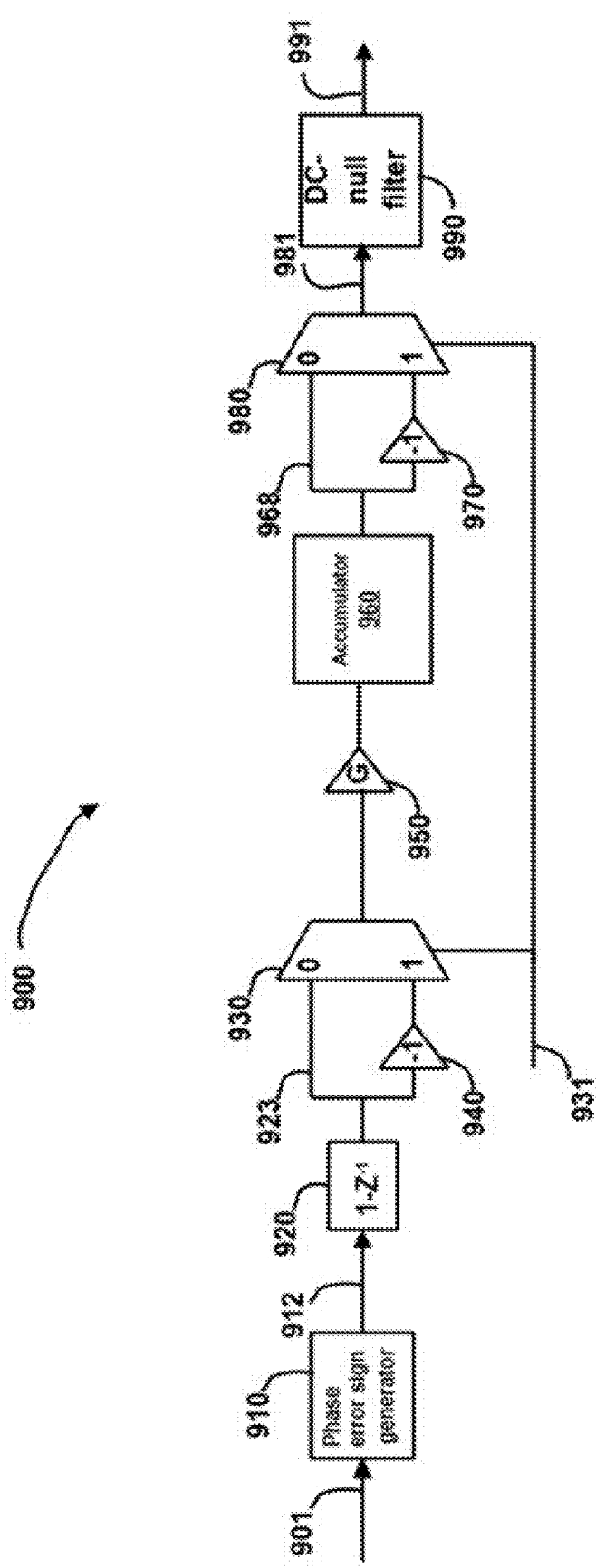
FIG. 9 is a block diagram depicting a simplified view of the compensation block.

FIG. 9 is a diagram conceptually depicting compensation block 410 shown in FIG. 8A. Phase error sign generator 910 generates the phase error sign (on path 912) between reference and feedback clocks received on path 901. Differentiator 920 converts the phase errors to frequency errors, which are multiplied either by +1 (path 923) or −1 by multiplier 940 to generate the positive and negative correction values at the inputs of multiplexer 930. Multiplexer 930 forwards either the positive correction value (when the value of correlation sequence 931) is zero, or the negative correction frequency (when the value of correlation sequence 931) is 1. The respective values of correction values are passed through a gain block 950 and accumulator 960. The output of accumulator 960 is multiplied by either +1 (path 968) or −1 (multiplier 970) based on the current value of correlation sequence 931, to provide positive and negative correction values (+delta-f and −delta-f) at corresponding correct instants on path 981.

Referring again to FIG. 8A, according to another aspect of the present disclosure, and in an alternative embodiment, DC-null filter 845 is introduced between the output of multiplier 840 and DSM 860. Flip-flop 850 is used as pipe-line element to close digital timing for high speed operation. The effect of the introduction of filter 845 is to reduce or eliminate noise at and/or near DC (zero hertz) of the signal at node 852 that may be caused due to DC errors induced due to multiplier (840) mixing operation, and/or due to any residual noise caused by one or more components in the correction pathway. A DC error on path 852 would have caused a fixed frequency error (offset) in the frequency of output clock 441. DC-null filter 845 effectively completely eliminates such DC frequency offset. Thus, the introduction of DC-null filter 845 will enable frequency synthesis by PLL 400 with zero (or minimal) frequency error and minimal close-in phase noise at the final clock output, i.e., output clock 441. In FIG. 9, DC-null filter 990 corresponds to DC-null filter 845 of FIG. 8A. The equivalent of filter 830 is not shown in FIG. 9, but can be added.

Figure 10:
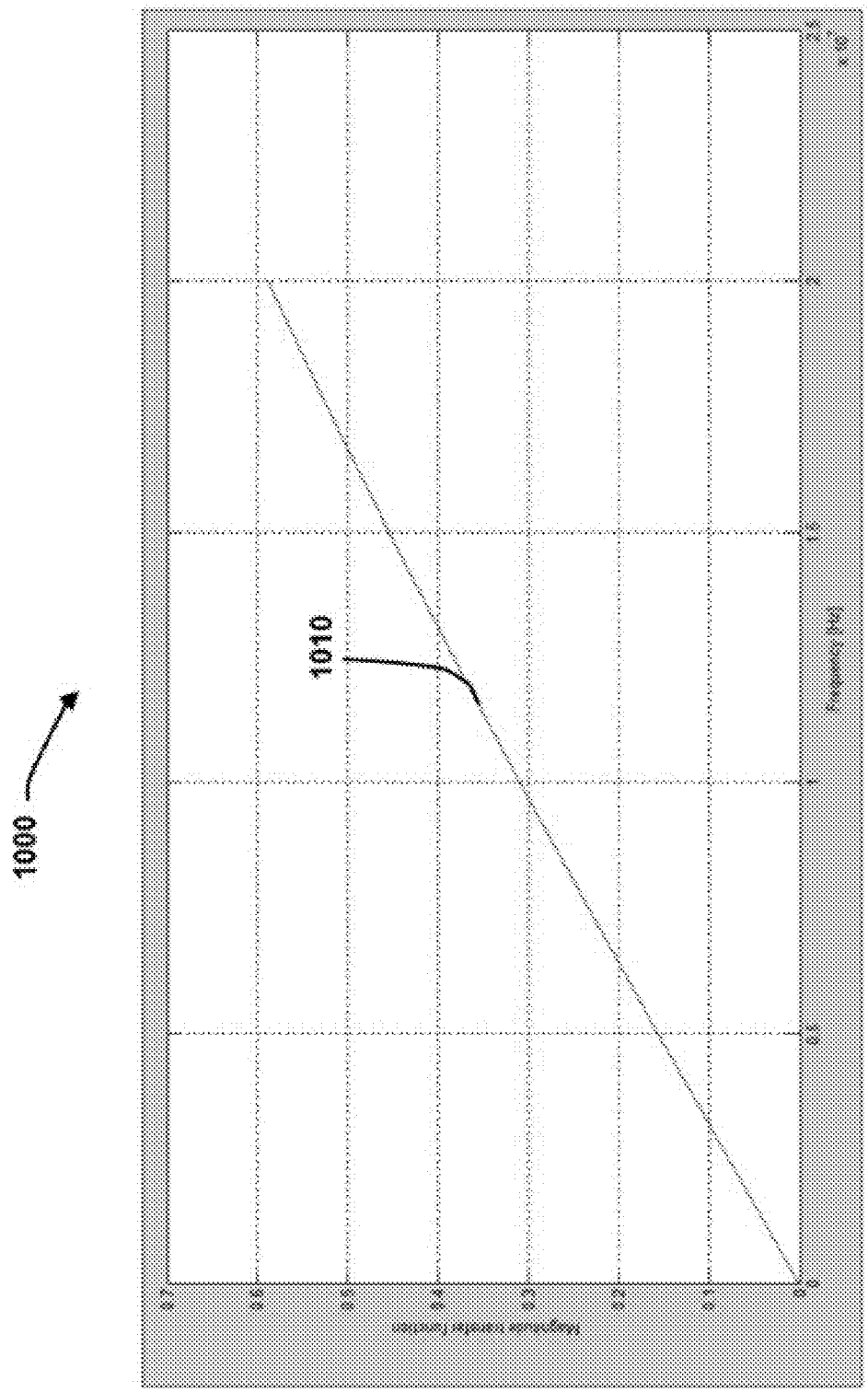
FIG. 10 is a plot depicting the response of a DC-nulling filter in the compensation block in an embodiment.

In an embodiment, DC-null filter 845 is implemented as a two-tap comb filter. A portion of an example transfer function of filter 845 is graphically depicted in FIG. 10. In graph 1000 of FIG. 10, magnitude of transfer function is represented along the y-axis, and frequency along the x-axis. Curve 1010 shows a portion of the example transfer function of the comb filter noted above. It may be observed that magnitude response of the transfer function at DC is a null (zero).

Figure 11:
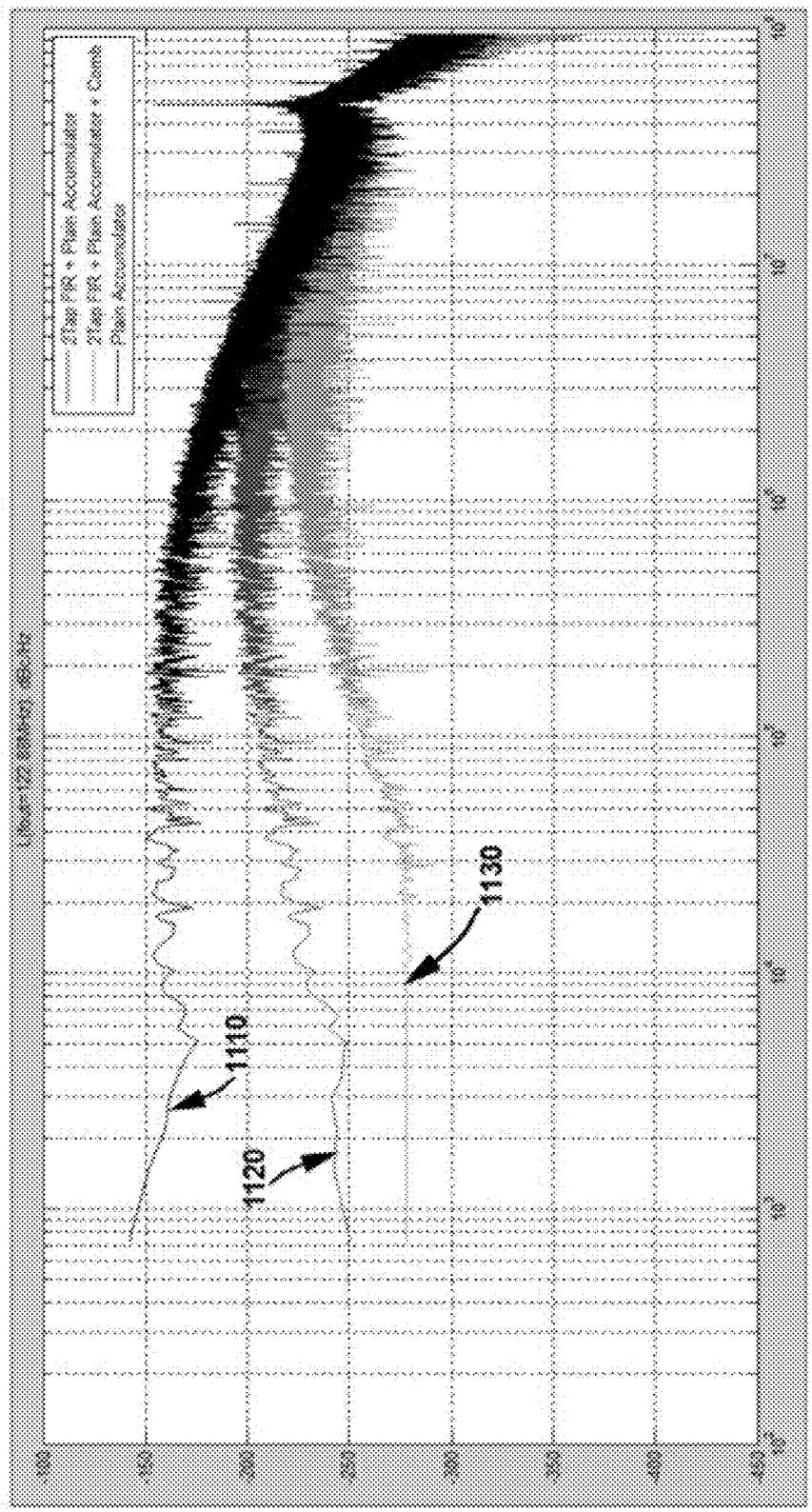
FIG. 11 is a plot of phase noise vs frequency in an output clock for various combinations of the compensation loop filter configuration.

FIG. 11 is a diagram showing three plots of the magnitude (Y axis) of phase noise in the output clock (441) at various frequencies (X axis) based on simulations. Plot 1110 shows the phase noise when filters 830 and 845 are not used in compensation block 410. Plot 1120 shows the phase noise when only filter 830 is used. Plot 1130 shows the phase noise when both filters 830 and 845 are used. It may be observed that the use of both filters 830 and 840 results in the best phase noise performance.

PLL 400 implemented as described above can be incorporated in a larger device or system as described briefly next.

6. Example System

Figure 12:
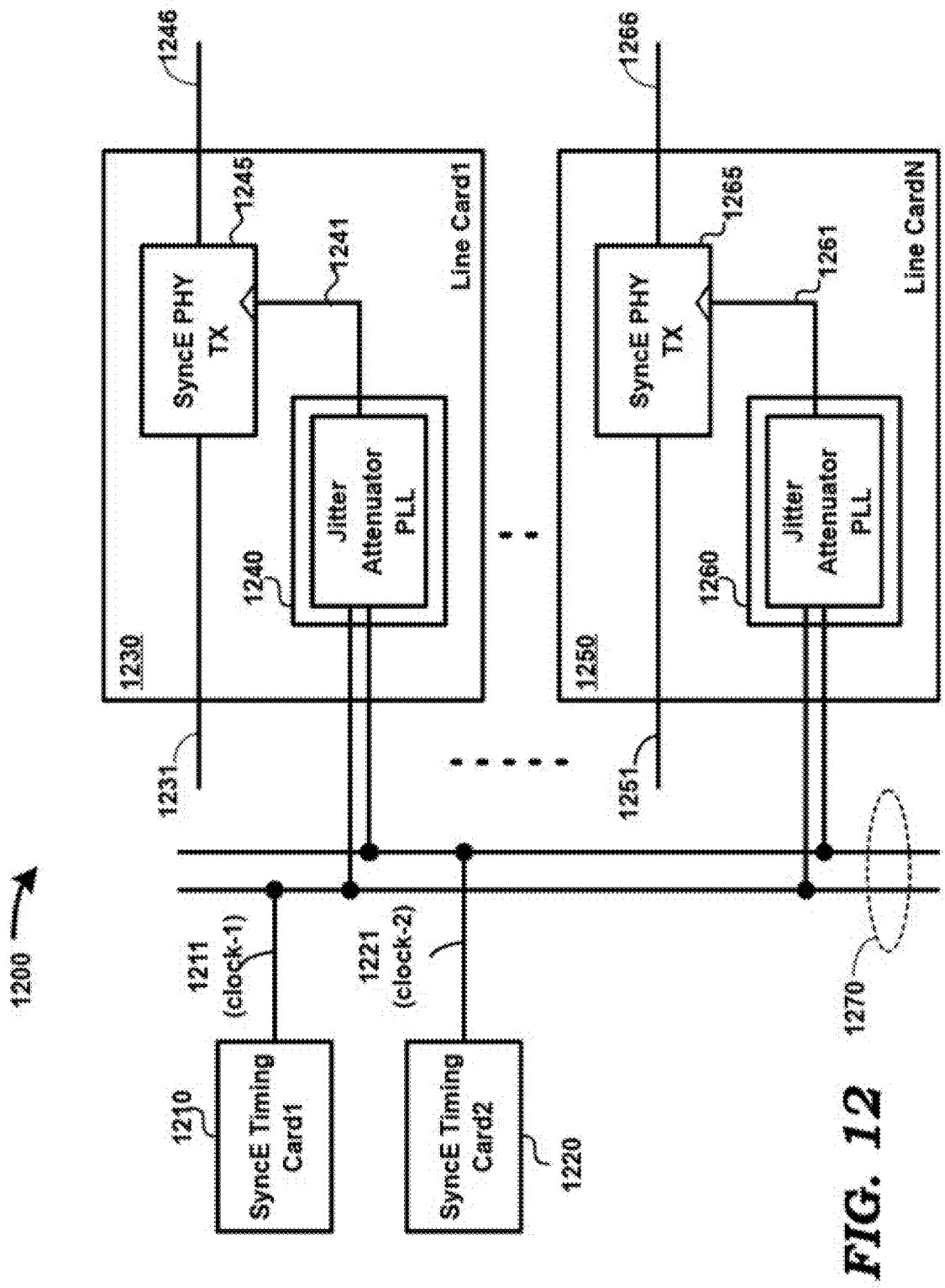
FIG. 12 is a block diagram illustrating an example system employing a PLL in an embodiment.

FIG. 12 is a block diagram of an example system containing a PLL incorporating a TDC with counters and count logic implemented according to various aspects of the present disclosure, as described in detail above. System 1200 is shown containing SyncE (Synchronous Ethernet) timing cards (1210 and 1220) and line cards 1 through N, of which only two line cards 1230 and 1250 are shown for simplicity. Line card 1230 is shown containing jitter attenuator PLL 1240 and SyncE PHY Transmitter 1245. Line card 1250 is shown containing jitter attenuator PLL 1260 and SyncE PHY Transmitter 1265. The components of FIG. 12 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 1210 or 1220). Accordingly, Ethernet packets are re-timed with respect to the master clock, and then transmitted in the physical layer. Thus, data packets (e.g., on path 1231 and 1251) are re-timed and transmitted without any time stamp information being recorded in the data packet. The packets may be generated by corresponding applications such as IPTV (Internet Protocol Television), VoIP (Voice over Internet Protocol), etc.

Thus, line card 1230 receives a packet on path 1231, and forwards the packet on output 1246 after the packet has been re-timed (synchronized) with a master clock. Similarly, line card 1250 receives a packet on path 1251, and forwards the packet on output 1266 after the packet has been re-timed (synchronized) with a master clock.

The master clock (1211/clock 1) is generated by timing card 1210. Timing card 1220 generates a redundant clock (1221/clock-2) that is to be used by line cards 1230 and 1250 upon failure of master clock 1211. Master clock 1211 and redundant clock 1221 are provided via a backplane (represented by numeral 1270) to each of lines cards 1230 and 1250.

In line card 1230, jitter attenuator PLL 1240 is implemented as PLL 400 described above in detail. PLL 1240 generates an output clock 1241 which is used to synchronize (re-time) packets received on path 1231 and forwarded as re-timed packets on path 1246.

Similarly, in line card 1250, jitter attenuator PLL 1260 is implemented as PLL 400 described above in detail. PLL 1260 generates an output clock 1261 which is used to synchronize (re-time) packets received on path 1251 and forwarded as re-timed packets on path 1266.

7. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1, 4, 5, 6, 8A, 9 and 12, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

In the instant application, the power and ground terminals are referred to as constant reference potentials.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A fractional-N phase locked loop (PLL) comprising:
a reference clock source to generate a reference clock, wherein successive periods of said reference clock have unequal time durations;
a phase detector to receive said reference clock and a feedback clock, said phase detector to generate an error signal representative of a phase difference between said reference clock and said feedback clock;
a low-pass filter (LPF) coupled to receive said error signal, and to filter said error signal to generate a filtered error signal;
a controlled oscillator coupled to receive said filtered error signal, and to generate an output clock having an output frequency that is proportional to a strength of said filtered error signal;
a fractional-N frequency divider block coupled to receive said output clock, said fractional-N frequency divider block to divide a frequency of said output clock by a desired division factor to generate said feedback clock, wherein said desired division factor has a first integer portion and a first decimal fraction portion,
wherein division of said frequency of said output clock by said desired division factor is designed to cause said output frequency to equal the product of said reference frequency and said desired division factor; and
a compensation block to generate a compensation factor to compensate for the effects of unequal successive periods of said reference clock, wherein said compensation factor has a second integer portion and a second decimal fraction portion,
wherein said fractional-N frequency divider block is designed to generate a modified division factor by combining said desired division factor and said compensation factor, wherein each modified division factor comprises a corresponding second integer and a corresponding second decimal fraction portion, wherein said combining is designed to remove noise in said output clock caused by said effects of unequal successive periods of said reference clock, wherein said fractional-N frequency divider block comprises:
- a division circuitry to divide said output clock by a sequence of divisor values to generate said feedback clock, wherein each divisor value is an integer; and
- a division factor generator to generate said sequence of divisor values, wherein said division factor generator comprises:
  - a splitter to generate a corresponding integer portion and a corresponding residue portion, the sum of which equals a sum of said compensation factor and said desired division factor,
  - wherein said corresponding integer portion contains at least a part of integer value generated by summing said compensation factor and said first decimal fraction portion,
  - a modulator core designed to generate a respective logic stream of integers corresponding to each residue portion, wherein the logic stream of integers represent a magnitude of the residue portion in a density domain,
  - wherein each integer of the logic stream is added to the corresponding integer portion to generate a corresponding divisor value of said sequence of divisor values.

2. The fractional-N phase locked loop (PLL) of claim 1, wherein said reference clock source comprises:
- a source clock source to generate a source clock; and
- a frequency doubler to generate said reference clock by doubling the frequency of said source clock,
- wherein asymmetry of said source clock causes said reference clock to have successive periods of unequal time durations.

3. The fractional-N phase locked loop (PLL) of claim 1, wherein said corresponding integer portion contains all of said integer value generated by said summing.

4. The fractional-N phase locked loop (PLL) of claim 3, wherein said modulator is a delta-sigma modulator (DSM) having a signal transfer function (STF), wherein said STF always generates only an integer value as an output in response to an integer value received as input.

5. The fractional-N phase locked loop (PLL) of claim 4, wherein said STF is a delay value, said division factor generator further comprising a delay unit to implement said delay value thereby causing said corresponding integer portion to be delayed by said delay value.

6. The fractional-N phase locked loop (PLL) of claim 5, wherein said delay unit is comprised of a chain of delay units.

7. The fractional-N phase locked loop (PLL) of claim 5, wherein said compensation block comprises:
- a correction block to generate a correction signal comprising a first frequency correction factor and a second frequency correction factor for a first period and a second period constituting each pair of said successive periods, said correction signal also containing a noise component at direct current (DC); and
- a filter to remove said noise component at DC from said correction signal to generate said compensation factor comprising said first frequency correction factor and said second frequency correction factor.

8. A system comprising:
a first timing card to generate a reference clock;
a line card coupled to receive a data packet, and re-time said data packet with reference to an output clock, and to transmit a re-timed packet,
wherein said line card comprises a fractional-N phase locked loop (PLL) coupled to receive said reference clock, said PLL to provide said output clock based on said reference clock, wherein successive periods of said reference clock have unequal time durations, wherein said PLL comprises:
- a phase detector to receive said reference clock and a feedback clock, said phase detector to generate an error signal representative of a phase difference between said reference clock and said feedback clock;
- a low-pass filter (LPF) coupled to receive said error signal, and to filter said error signal to generate a filtered error signal;
- a controlled oscillator coupled to receive said filtered error signal, and to generate an output clock having an output frequency that is proportional to a strength of said filtered error signal;
- a fractional-N frequency divider block coupled to receive said output clock, said fractional-N frequency divider block to divide a frequency of said output clock by a desired division factor to generate said feedback clock, wherein said desired division factor has a first integer portion and a first decimal fraction portion,
wherein division of said frequency of said output clock by said desired division factor is designed to cause said output frequency to equal the product of said reference frequency and said desired division factor; and
- a compensation block to generate a compensation factor to compensate for the effects of unequal successive periods of said reference clock, wherein said compensation factor has a second integer portion and a second decimal fraction portion,
wherein said fractional-N frequency divider block is designed to generate a modified division factor by combining said desired division factor and said compensation factor, wherein each modified division factor comprises a corresponding second integer and a corresponding second decimal fraction portion, wherein said combining is designed to remove noise in said output clock caused by said effects of unequal successive periods of said reference clock, wherein said fractional-N frequency divider block comprises:
- a division circuitry to divide said output clock by a sequence of divisor values to generate said feedback clock, wherein each divisor value is an integer; and
- a division factor generator to generate said sequence of divisor values, wherein said division factor generator comprises:
  - a splitter to generate a corresponding integer portion and a corresponding residue portion, the sum of which equals a sum of said compensation factor and said desired division factor,
  - wherein said corresponding integer portion contains at least a part of integer value generated by summing said compensation factor and said first decimal fraction portion,
  - a modulator core designed to generate a respective logic stream of integers corresponding to each residue portion, wherein the logic stream of integers represent a magnitude of the residue portion in a density domain, wherein each integer of the logic stream is added to the corresponding integer portion to generate a corresponding divisor value of said sequence of divisor values.

9. The system of claim 8, wherein said reference clock source comprises:

a source clock source to generate a source clock; and a frequency doubler to generate said reference clock by doubling the frequency of said source clock, wherein asymmetry of said source clock causes said reference clock to have successive periods of unequal time durations.

10. The system of claim 8, wherein said corresponding integer portion contains all of said integer value generated by said summing.

11. The system of claim 10, wherein said modulator is a delta-sigma modulator (DSM) having a signal transfer function (STF), wherein said STF always generates only an integer value as an output in response to an integer value received as input.

12. The system of claim 11, wherein said STF is a delay value, said division factor generator further comprising a delay unit to implement said delay value thereby causing said corresponding integer portion to be delayed by said delay value.

13. The system of claim 12, wherein said delay unit is comprised of a chain of delay units.

14. The system of claim 12, wherein said compensation block comprises:

a correction block to generate a correction signal comprising a first frequency correction factor and a second frequency correction factor for a first period and a second period constituting each pair of said successive periods, said correction signal also containing a noise component at direct current (DC); and a filter to remove said noise component at DC from said correction signal to generate said compensation factor comprising said first frequency correction factor and said second frequency correction factor.

\* \* \* \* \*